United States Patent

Lidorenko et al.

[15] 3,653,971

[45] Apr. 4, 1972

[54] SEMICONDUCTOR PHOTOELECTRIC GENERATOR

[72] Inventors: Nikolai Stepanovich Lidorenko, 3 Mytishinskaya, 14-a, kv. 127; Arkady Pavovich Landsman, Rizhsky proezd, 3, kv. 140; Dmitry Semenovich Strebkov, Luganskya, 21; Aita Konstantinovna Zaitseva, 3 Mytischinskaya ulitsa, 14, kv. 81; Vitaly Viktorovich Zadde, Moscowposelok Severny, 9 Linia 3, kv. 120; Viktor Sergeevich Kosarev, 12 Novokuzminskaya ulitsa 4, korpus 2, kv. 2., all of Moscow, U.S.S.R.

[22] Filed: July 9, 1969

[21] Appl. No.: 840,307

[52] U.S. Cl. ....... 136/89

[51] Int. Cl. ....... H01l 15/02

[58] Field of Search ....... 136/89

[56] References Cited

UNITED STATES PATENTS

| | | | |
|---|---|---|---|
| 2,994,054 | 7/1961 | Peterson | 136/89 |
| 3,369,939 | 2/1968 | Myer | 136/89 |
| 3,433,677 | 3/1969 | Robinson | 136/89 |

*Primary Examiner*—Allen B. Curtis
*Attorney*—Holman & Stern

[57] ABSTRACT

A semiconductor photoelectric generator is formed of semiconductor photoelectric converters united into a solid-state matrix, each converter having the shape of a microminiature parallelepiped and containing; an alloy region; a base region; at least one P-N junction making an angle with an operating surface of the generator exposed to radiation; a metallic conductor on at least one of said regions making the same angle with the operative surface as the P-N junction and deposited all over the parallelepiped-surface uniting the parallelepipeds of the converters into a matrix; and wherein the width of a microminiature parallelepiped is approximately equal to the diffusion length of minority carriers in said base region.

7 Claims, 13 Drawing Figures

SEMICONDUCTOR PHOTOELECTRIC GENERATOR

The present invention relates to devices for conversion of radiant into electric energy, and more specifically to semiconductor photoelectric generators and to methods of their manufacture.

There exist semiconductor photoelectric generators obtained by fusing an impurity through a slab of a semiconductor material and comprising a plurality of series-connected segment alloy regions of three types: a slab of a semiconductor material, such as N-type silicon; alloy regions forming an ohmic contact with the semiconductor and fabricated from, say, gold; and alloy regions of a semiconductor material of the opposite type of conduction, such as P-type silicon, fabricated by fusing N-type silicon with aluminum. All segment regions are arranged at right angles to the surface of the generator exposed to radiation. In the subsequent discussion, this surface will be referred to as the operating surface of the generator.

A disadvantage of these generators is considerable dimensions of all regions. For example, like regions are spaced about 1 cm apart (between centers).

Another disadvantage is the segment shape of alloy regions because of which the efficiency is reduced owing to absorption of light in the central portion of the segments and to the shadow appearing on the unilluminated side of the generator.

Still another disadvantage is that the alloy regions and the compensated impurity region with an alloy ohmic contact impair the characteristics of the generator owing to the non-uniform distribution of the impurity across the front of fusion and the short life-time of carriers in the compensated region.

There also exist semiconductor photoelectric generators made up of a plurality of N-P-N regions, obtained by diffusion of impurities into a slab of a semiconductor material through a mask or stencil. One of the P-N junctions in the N-P-N regions is shunted by a metallic contact located on the rear side of the generator, parallel to the operating surface of the generator, or is compensated by diffusion of gold or injection of radiation defects.

A disadvantage of these generators is that the spacing between the centers of like conduction regions is several millimeters. The parasitic compensated P-N junction impairs the efficiency owing to the waste of the operating surface area, and also owing to an increase in the series resistance and recombination of carriers in the compensated region.

Another disadvantage is that the thickness of the generator, that is, the spacing between the rear and operating surfaces is limited to about 0.1 mm owing to the limitation of the diffusion method and structural features of the generator.

Also known in the art are semiconductor photoelectric generators fabricated from separate photo-cells with P-N junctions on three faces and with ohmic contacts, in which regions of like or unlike conduction are then interconnected as required. Two of the three planes of P-N junctions are parallel to the operating surface of the generator, while the third one is at right angles to it.

A disadvantage of such generators is the large size of the individual photo-cells, sometimes running into several millimeters, and also the difficulties in fabricating and interconnecting the photo-cells in the generator. Because of this, the leakage resistance of the base is increased in each photo-cell. In order to reduce this resistance, it has been suggested to fabricate multi-layer photo-cells by the epitaxial-growth method, which however complicates the manufacture of generators still more.

There exists a method for the fabrication of combination semiconductor devices, consisting in that with a view to preventing a layer of solder from short-circuiting P-N junctions in the assembly of H.T.diodes slabs with P-N junctions are stacked up in a pile, and fused, and the pile thus obtained is cut into P-N junctions of the requisite configuration.

A disadvantage of this method is that it does not provide for the manufacture of photo-electric converters with a P-N junction on two, three, four, or five faces.

The disadvantages common to all existing types of generators are, thus, low efficiency, low voltage and current density, and low level of radiation at which saturation current (and power) is attained, so that the requisite efficiency of energy conversion at high radiation intensities is not secured.

An object of the present invention is to eliminate the above listed disadvantages by producing microminiature photo-electric converters.

One object of the invention is to eliminate the above-listed disadvantages by producing microminiature photo-electric converters.

Another object of the invention is to provide a semiconductor photo-electric generator having a greater efficiency as compared with existing generators.

Still another object of the invention is to enhance the current and voltage sensitivity of the generator.

A further object of the invention is to provide a semiconductor photo-electric generator which increases its power output with increase of irradiation along linear rise of operating current.

In accordance with these and other objects, the invention consists in that in a semiconductor photoelectric generator in which the P-N junction and the metallic conductor of at least one region of each semiconductor photoelectric converter make an angle with the operating surface of the generator on which radiation is incident, the semiconductor photoelectric converters have, according to the invention, the shape of microminiature parallelepipeds united into a solid-state matrix by joining together the conductors deposited over the entire face of the parallelepiped, while the width of each microminiature parallelepiped is approximately equal to the diffusion length of the minority carriers in the base region.

It is preferable to combine the main P-N junction with two additional planes arranged in parallel with the operating surface of the generator, which makes it possible to enhance the efficiency or the generator while maintaining high voltage sensitivity.

For greater efficiency, it is preferable to provide in each semiconductor photo-electric converter an additional P-N junction parallel with the main P-N junction and united with it by a further P-N junction whose plane is parallel with those side faces which do not carry P-N junctions, while on those faces of the parallelepiped which carry a P-N junction to deposit conductors over their entire surface, and to unite the photo-electric converters into a matrix by means of the conductors between the regions of the same conduction type, placed in parallel with the said P-N junctions, while the base regions of all photo-electric converters should have a common conductor deposited on the side opposite to the operating surface of the generator.

This arrangement provides for high current sensitivity.

The efficiency and current sensitivity of the generator can be enhanced by uniting the main and additional P-N junctions in each photo-electric converter by means of a further P-N junction whose plane is parallel to the operating surface of the generator.

With a view to increasing power output and efficiency of the generator while maintaining linear rise of the operating current, it is preferable to make the length of the microminiature parallelepiped not greater than the diffusion length of the minority carriers in the base region.

Maximum efficiency along with maximum current and voltage sensitivity and also limiting power output are secured in the generator disclosed herein by the fact that the P-N junction can be arranged so that its planes will be parallel to four or five faces of the parallelepiped, and the length of the microminiature parallelepiped will not exceed the diffusion length of the minority carriers in the base region.

A semiconductor photoelectric generator is fabricated in the form of a solid-state matrix from microminiature photoelectric converters with P-N junctions on three, four, or five faces by cutting a pile of slabs with pre-formed P-N junctions, stacked up by use of their metal conductors, and by forming additional P-N junctions in the matrices thus obtained by injection of impurities through, say, ion sputtering.

So that the matrices can be assembled and connected without manual labor, and also so that a generator can be fabricated in the form of a cellular monolithic structure from microminiature photo-electric converters whose linear dimensions are approximately equal to the diffusion length of the minority carriers in the base region, it is preferable to unit matrices into piles by means of metallic or insulating layers, to cut up the piles, and to obtain lacking P-N junctions by injection of impurities through, say, ion sputtering.

Other objects and advantages of the present invention will be best understood from the following description of preferred embodiments when read in connection with the accompanying drawings, in which.

Figure 1:
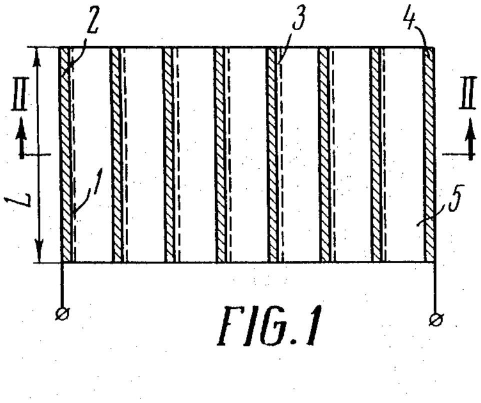
FIG. 1 is a general view of a generator in the form of a matrix of photo-electric converters with a P-N junction parallel to one face, according to the invention.

Referring to FIG. 1, there is a semiconductor photo-electric generator which is a solid-state matrix from semiconductor photoelectric converters with P-N junctions 1, conductors 2 to an alloy region 3 and conductors 4 to a base region 5, arranged at right angles to an operating surface 6 (FIG. 2) of the generator. In the general case, the planes of the P-N junctions 1 make an angle with the operating surface 6. The photo-electric converters are microminiature parallelepipeds whose width D is approximately equal to the diffusion length of the minority carriers in the base region 5 (FIG. 1).

The typical dimensions of photo-electric converters in a silicon matrix are as follows: the width of the alloy region is 0.5 to 10 microns, the width of the base region is 90 to 400 microns, the thickness B of the matrix is 0.1 to 10 mm, the length L of the microminiature parallelepiped is 0.2 to 40 mm, and the width of the contact region is 3 to 10 microns.

The design of the generator and the material of the contacts make it possible to vary the number of photo-electric converters interconnected in a generator without impairing its characteristics as a whole. With L = 1 cm, a solid-state matrix can accommodate over 50 P-N junctions per square centimeter of its surface area and obtain (in the case of silicon) over 25 volts from every square centimeter of the operating surface of the generator. In the subsequent discussion, this quantity will be referred to as voltage density.

The fact that the width of the alloy and base regions is equal to the diffusion length of the minority carriers provides for complete collection of the minority carriers moving in the direction of the P-N junction.

Figure 3:
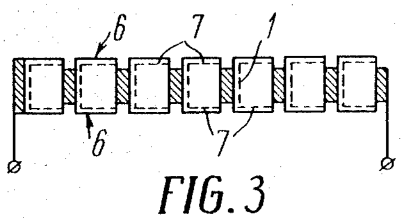
FIG. 3 is a longitudinal section through a generator in the form of a matrix of photo-electric converters with a P-N junction parallel to three faces, according to the invention.

In the embodiment of FIG. 3, each photo-electric converter in the solid-state matrix has, apart from the main P-N junction 1, additional P-N junctions 7 connected to the main one and arranged in parallel with the operating surface 6.

The increase in energy conversion efficiency in such a generator is secured by the fact that, owing to the microminiature dimensions of the photo-electric converters, there is complete collection of the minority carriers generated in the base region as they move towards the three faces with P-N junctions. The maximum voltage density remains the same—over 25 volts per square centimeter of the operating surface of the generator (when using silicon).

Figure 4:
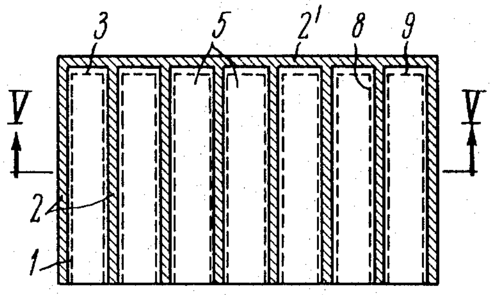
FIG. 4 is a general view of another embodiment of a generator with a P-N junction parallel to three faces, according to the invention.
Figure 5:
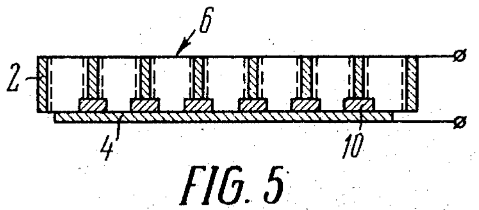
FIG. 5 is section V—V of FIG. 4.

In the embodiment of FIGS. 4 and 5, each photo-electric converter has, apart from the main P-N junction 1 and the additional P-N junction 8 in parallel with the main one, also a further P-N junction 9 which unites the P-N junctions 1 and 8. The P-N junction 9 is arranged on one of the side faces of the microminiature parallelepiped. The three side faces of the parallelepiped containing the P-N junctions 1, 8, and 9, are at right angles to the operating surface 6 and have a conductor 2 to the alloy region 3, deposited over the entire surface of the P-N junctions 1 and 8. The P-N junction 9 with a continuous conductor 2' provides for parallel connection of the alloy regions 3 of all photo-electric converters in the matrix. The base regions 5 are interconnected on the side opposite to the operating surface 6, by means of the conductor 4 common to all base regions and insulated from the alloy region 3 by an insulating layer 10.

Parallel connection of the alloy and base regions, in conjunction with the microminiaturization of the photo-electric converters provides for higher current sensitivity, while the additional P-N junction parallel with the main one increases the conversion efficiency of the generator, since it secures complete collection of all minority carriers generated in the base regions and moving in the direction of the two P-N junctions.

Figure 6:
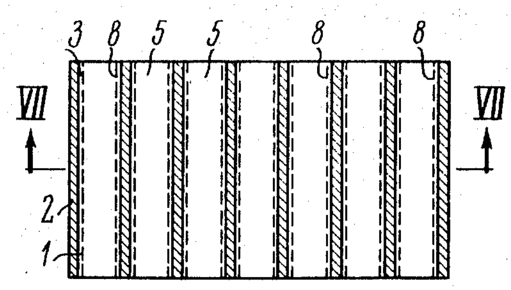
FIG. 6 is a general view of one more embodiment of a generator with a P-N junction parallel to three faces, according to the invention.
Figure 7:
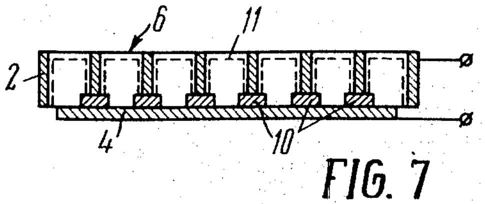
FIG. 7 is section VII—VII of FIG. 6.

In the embodiment of FIGS. 6 and 7, each photo-electric converter has, apart from the main P-N junction 1 and a parallel additional P-N junction 8, also a further P-N junction 11 uniting the P-N junctions 1 and 8. The P-N junction 11 is parallel to the operating surface of the generator. The P-N junctions on three faces of the photo-electric converters enhance the current sensitivity and conversion efficiency of the generator, because they provide for complete collection of all minority carriers generated in the base region and moving in the direction of the three P-N junctions.

Figure 8:
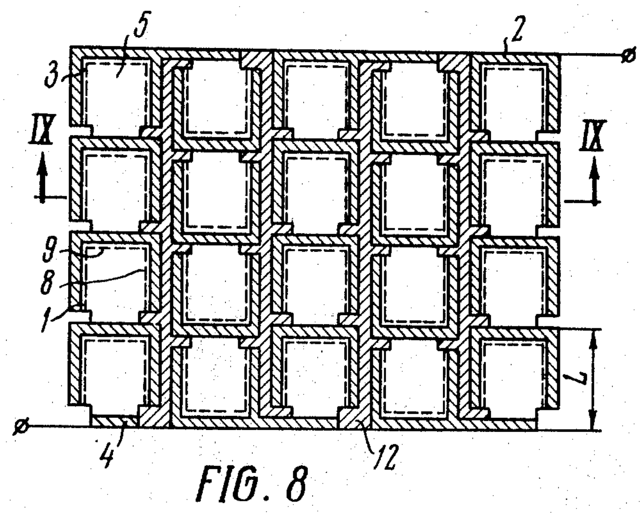
FIG. 8 is a general view of a generator in the form of a cellular monolithic structure from microminiature photo-electric converters with P-N junctions parallel to three faces, according to the invention.
Figure 9:
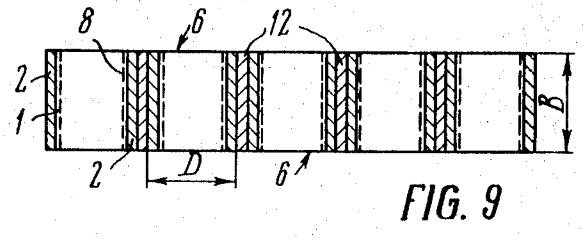
FIG. 9 is section IX—IX of FIG. 8.

In the embodiment of FIGS. 8 and 9, the microminiature photo-electric converters are interconnected into a cellular monolithic structure. The photo-electric converters are microminiature parallelepipeds whose width D and length L are approximately equal to the diffusion length of the minority carriers in the base region. Each microminiature photo-electric converter, as each photo-electric converter in FIGS. 4 and 5, has, apart from the main P-N junction 1 and a parallel P-N junction 8, also a further P-N junction 9 uniting the P-N junctions 1 and 8 located on a side face of the parallelepiped, at right angles to the operating surface 6. The conductor 2 is deposited over the entire surface of the P-N junctions 1, 8, and 9.

In contrast to the solid-state matrix of FIGS. 4 and 5, the cellular monolithic structure in question has all photo-electric converters connected in series, while the individual sections are insulated from one another by an insulating layer 12. The conductors of the base region are insulated from the alloy region 3 also by an insulating layer 12. This embodiment of the generator has a greater efficiency as compared with the generator of FIGS. 4 and 5, because all minority carriers generated in the base region and moving in the direction of the P-N junctions reach the latter. The typical dimensions of the photo-electric converters in a cellular monolithic silicon structure are as follows: the length L of a microminiature parallelepiped is 100 to 400 microns; the width D of a microminiature parallelepiped is 100 to 400 microns; the width B is 0.200 to 10 millimeters; the width of the insulating layer is 3 to 10 microns; the width of the current-collecting leads is 3 to 10 microns. Each square centimeter of the cellular monolithic structure can accommodate over 500 photo-electric converters.

The fact that the P-N junctions are arranged on three faces of each microminiature photo-electric converter in the cell, that the P-N junctions are at right angles to the operating surface of the generator, and that the conductors are deposited over the entire surface of the P-N junctions enables this monolithic silicon structure to be used under conditions of super-high concentrations of luminous flux and to generate over 10 watts per square centimeter of the operating surface, with linear rise in operating current.

Figure 10:
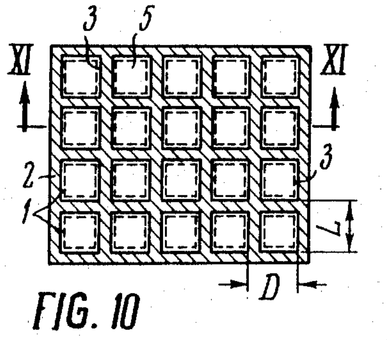
FIG. 10 is a general view of a generator in the form of a cellular monolithic structure from microminiature photo-electric converters with P-N junctions parallel to five faces, according to the invention.
Figure 11:
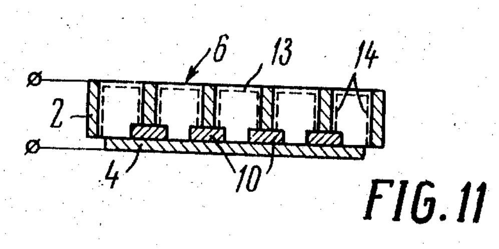
FIG. 11 is section XI—XI of FIG. 10.

FIGS. 10 and 11 show a generator which is a cellular monolithic structure from interconnected microminiature photo-electric converters. The photo-electric converters are microminiature parallelepipeds in which the width D and the length L are approximately equal to the diffusion length of the minority carriers generated in the base region 5. The P-N junctions are arranged in parallel with five faces of the parallelepiped, one P-N junction 13 being parallel to the operating surface 6, and the remaining four P-N junctions 14 are at right angles to the latter.

The microminiature photo-electric converters are interconnected in parallel by the conductors 2 deposited over the entire area of the side faces. The conductor 4 is deposited on the sixth face of the microminiature photo-electric converter, not carrying a P-N junction and parallel to the operating surface 6. In order to isolate the conductor 4 from the alloy region 3, part of the latter is etched away, and the space left is filled with an insulating layer 10.

The arrangement of P-N junctions on five faces reduces the series resistance of the generator and raises its efficiency to 80 percent in the case of monochromatic radiation, since all minority carriers generated in the base region and migrating towards the five of six faces of the microminiature photo-electric converter reach the P-N junctions.

Furthermore, since the individual cells have small dimensions, the generator can serve as a light-beam position detector. In such a case, each microminiature photo-electric converter has a separate conductor 14, while the P-N junction 13 parallel with the operating surface may be omitted.

Figure 12:
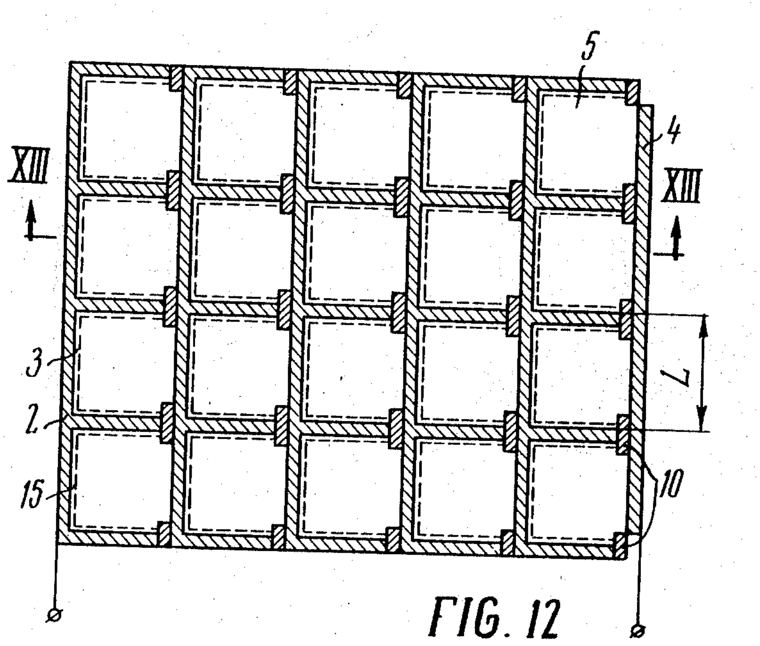
FIG. 12 is another embodiment of a generator with P-N junctions parallel to five faces, according to the invention.
Figure 13:
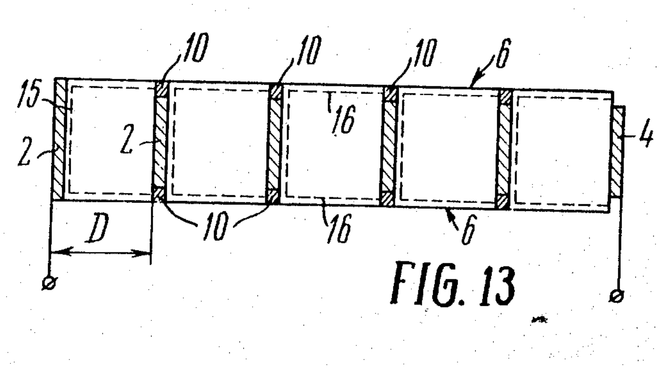
FIG. 13 is section XIII—XIII of FIG. 12.

FIGS. 12 and 13 show a generator comprising microminiature photo-electric converters interconnected into a cellular monolithic structure. In each microminiature photo-electric converter the P-N junction is arranged in parallel with five (out of the six) faces of the parallelepiped, so that the planes of three P-N junctions 15 are at right angles to the operating surface, and two P-N junctions 16 are parallel with the latter. The lead 4 is at right angles to the operating surface 6. The photo-electric converters are connected in parallel by means of the conductors 2 and in series by means of the conductors 4. In order to isolate the conductor 4 from the alloy region 3, some of the latter is etched away, and the space thus left is filled with an insulating layer 10.

The series-parallel connection of the photo-electric converters enhances the reliability of the generator, while the conductors deposited on planes which are at right angles to the operating surface make it possible to utilize two sides of the generator as operating surfaces. When only one is used, one of the P-N junctions 14 parallel to the operating surface may be omitted.

Figure 2:
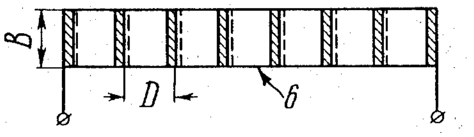
FIG. 2 is a section II—II of FIG. 1.

The method for the manufacture of a semiconductor photoelectric generator is illustrated by reference to the fabrication of a silicon generator in accordance with FIGS. 1, 2, and 3.

Metal-plated slabs of P-type silicon with pre-formed P-N junctions are brazed together over their entire surface with the aid of lead or silver foil into a pile, the pile is sliced either at right or an oblique angle to the plane of the P-N junctions into matrices, the edges of the matrices are trimmed, the two operating surfaces of the matrices are polished, and the polished matrices are doped with phosphorous or any other donor impurity by ion sputtering or low-temperature diffusion so as to form in each photo-electric converter additional P-N junctions whose planes are parallel with the operating surface.

After that the matrices are dipped in an acid solution to etch away some of the conductor lands between the photo-electric converters, and as this is done, the shunts formed during the production of the additional P-N junctions are eliminated.

To fabricate a semiconductor photoelectric generator in accordance with FIGS. 8 and 9, use is made of solid-state matrices with additional P-N junctions obtained by ion sputtering and given an etch to remove the shunts, upon which chromium, nickel or silver is deposited by vacuum evaporation at an angle of 30° to 60° to the plane of the P-N junctions parallel with the operating surface. Because of a shadow area in the base region, no metal is deposited on the etched-away portion of the conductor land of the base, and the P-N junctions are not short-circuited.

Then, the matrices are cemented into a pile over their entire surface with a silicone varnish, glass, and ceramic in such a way that the planes of the P-N junctions normal to the operating surface are parallel in the various matrices, while the polarity of the P-N junctions in adjacent matrices are opposite.

Next, the matrices are series-connected and sliced at right angles to the plane of all P-N junctions into cellular monolithic structures which are polished from two sides.

To fabricate a generator in accordance with FIGS. 4 and 5, phosphorous is diffused into slabs of P-type silicon from all sides, the slabs are then nickel-plated and brazed into a pile, the pile is cut into matrices, the matrices are polished and cut to shape, part of the conductor lands on one side of the matrices is etched away, the space thus formed is filled with an insulating material, and a continuous conductor is deposited over the base region.

To fabricate a generator in accordance with FIGS. 6 and 7, before etching away some of the conductor land on one side, phosphorous is deposited by ion sputtering onto the opposite side so as to produce a P-N junction parallel to the operating surface.

To fabricate a generator in accordance with FIGS. 10 and 11, phosphorous is diffused into slabs of P-type silicon from all sides, the slabs thus treated are nickel-plated and assembled into a pile, the pile is cut into matrices, the matrices are polished and cut to shape. From two sides of each matrix, additional P-N junctions parallel to the operating surface are produced by ion sputtering. The matrices thus obtained are assembled into a pile in such a way that the planes of the P-N junctions normal to the operating surface will be parallel in the various matrices of the pile. The pile is cut to cellular monolithic structures which are polished.

On one side of the matrices, phosphorous is deposited by ion sputtering in order to produce a P-N junction parallel with the operating surface, while on the opposite side some of the conductor land and of the alloy layer are etched away, the space thus produced is filled with an insulating material, and a conductor is deposited over the base region.

In order to manufacture a generator according to FIGS. 12 and 13, finished generators according to FIGS. 6 and 7 are brazed into a pile with sides having opposite types of conduction is such a way that the planes of P-N junctions normal to the operating surface are parallel in the various generators in the pile. The pile is then cut into cellular monolithic structures, the latter are polished and are ion-sputtered with phosphorous from two sides so as to form additional P-N junctions parallel to the operating surface of the structure.

The method disclosed herein makes it possible to manufacture semiconductor photoelectric generators in the form of either a matrix or a cellular monolithic structure from microminiature photo-electric converters with P-N junctions on one, two three, four, or five faces. In the course of manufacture, all microminiature photo-electric converters are simultaneously given a complete cycle of treatment from surface working and introduction of impurities to application of conductor lands and testing for characteristics. This markedly simplifies their manufacture and enhances productivity.

The method disclosed herein lends itself readily to mechanization.

Thus, a generator in the form of a solid-state matrix from series-connected microminiature silicon photo-electric converters gives a voltage density of over 25 volts per square centimeter of the operating surface, and that in the form of a cellular monolithic structure, over 100 volts per sq. cm.

In all types of generator, the conductor lands of the alloy region account for not over 2 percent of the operating surface.

The continuous conductors on the faces of photo-electric converters, carrying P-N junctions and normal to the operating surface, and also the microminiature construction of the photo-electric converters combine to reduce the series resistance of each converter in the generator to at least one-tenth of what it is in existing types. Because of this, the generator performs efficiently even when the power of luminous flux exceeds 100 watts per square centimeter, that is, at 1,000 times the power of solar radiation, and the efficiency of the generator increases with increasing number of P-N junctions per unit volume. The maximum increase in the efficiency is observed in the case of monochromatic light with a wavelength corresponding to the uniform generation of minority carriers inside the semiconductor (1.5 microns for silicon).

The high efficiency (up to 80 percent) of the generator according to FIGS. 10 through 13, and the low series resistance of the alloy regions make it possible to use this type of generator as an efficient converter of high-power laser radiation.

Generators with P-N junction normal to the operating surface have a spectral response with a narrow peak at the boundary of the main absorption band (1.05 microns for silicon). Therefore, they may be used as infra-red detectors.

A generator in the form of a matrix assembled from photo-electric converters with N-P-N structure (FIGS. 4 and 5) may be used as a photo-transistor or a P-N-P-N semiconductor magnetometer. For this purpose, it is necessary to remove part of the matrix with the P-N junction 9.

The generator disclosed herein may also serve as a standard power meter for incident radiation within a broad range from zero to 1,000 watts per square centimeter.

The generator disclosed herein may also be used in altitude-control systems and for measuring angles of rotation relative to a source of radiation.

The method for the manufacture of a semiconductor photoelectric generator according to the invention is a further extension to and improvement upon planar technology, since it makes it possible to change over from the two-dimensional arrangement of elements on a substrate to a three-dimensional arrangement of active elements (diodes, triodes, etc.) with ohmic contacts between them and with a high density (over 1,000 active elements per cubic centimeter).

While the present invention is described in connection with preferred embodiments, it is and should be understood that there may be modifications and adaptations without any departure from the idea and scope of the invention, which those skilled in the art will readily comprehend.

Such modifications and adaptations should be comprehended to be within the spirit and scope of the invention and of the accompanying claims.

What we claim is:

1. A semiconductor photoelectric generator, comprising semiconductor photo-electric converters having the shape of microminiature parallelepipeds which are united into a solid-state matrix and each of which contains: an alloy region; a base region; a P-N junction making an angle with the operating surface of the generator exposed to incident radiation; a metallic conductor on at least one of said regions, making the same angle with said operating surface of the generator and deposited all over the face of said parallelepiped, said metallic conductor interconnecting said parallelepipeds into a matrix, and the width of said microminiature parallelepiped being approximately equal to the diffusion length of minority carriers in said base region.

2. A generator, as claimed in claim 1, in which there are two additional P-N junctions united with the main P-N junction and arranged in parallel with said operating surface of the generator.

3. A generator, as claimed in claim 1, in which each photo-electric converter has an additional P-N junction parallel to the main P-N junction, and a further P-N junction uniting said main and additional P-N junctions, whose plane is parallel to those side faces of the parallelepiped which carry no P-N junction, said conductors being deposited on those faces which carry a P-N junction, and said photo-electric converters being united into a matrix by means of the conductors between said regions with the same type of conduction, said base regions of all said photo-electric converters having a common conductor deposited on the side opposite to said operating surface of the generator.

4. A generator, as claimed in claim 3, which has a further P-N junction which unites said main and additional P-N junctions and whose plane is parallel to said operating surface of the generator.

5. A generator, as claimed in claim 3, in which the length of the microminiature parallelepiped does not exceed the diffusion length of minority carriers in said base region.

6. A generator, as claimed in claim 4, in which the length of the microminiature parallelepiped does not exceed the diffusion length of minority carriers in said base region.

7. A generator, as claimed in claim 1, in which the P-N junction is arranged so that its planes are parallel to four or five faces of the parallelepiped, and the length of the latter does not exceed the diffusion length of minority carriers in the base region.

* * * * *